(12) United States Patent
Matsuo

(10) Patent No.: US 6,895,478 B2
(45) Date of Patent: May 17, 2005

(54) MEMORY CONTROL CIRCUIT

(75) Inventor: Yoshikatsu Matsuo, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 146 days.

(21) Appl. No.: 10/072,934

(22) Filed: Feb. 12, 2002

(65) Prior Publication Data
US 2002/0113635 A1 Aug. 22, 2002

(30) Foreign Application Priority Data
Feb. 13, 2001 (JP) .................................. 2001-035559

(51) Int. Cl.[7] .............................................. G06F 12/00
(52) U.S. Cl. .................................... 711/150; 711/151
(58) Field of Search ................................ 711/150, 151

(56) References Cited

U.S. PATENT DOCUMENTS 4,698,753 A * 10/1987 Hubbins et al. ............ 709/209
2002/0156963 A1 * 10/2002 Duranton ..................... 711/5

* cited by examiner

Primary Examiner—Reginald G. Bragdon
(74) Attorney, Agent, or Firm—Junichi Mimura

(57) ABSTRACT

A memory control circuit includes a watching circuit for observing a first request signal from an external device for accessing to a RAM and a second request signal, which has a priority higher than the first request signal, from a CPU for accessing to the RAM. The memory control circuit further includes a control circuit having an OR gate, an AND gate and a NOR gate. When the first and second request signals are inputted, it is scheduled that an operation based on the second access request signal is performed by the control circuit prior to that based on the first access request signal.

6 Claims, 5 Drawing Sheets

MEMORY CONTROL CIRCUIT

CROSS-REFERENCE TO RELATED APPLICATION

This application claims the priority benefit of Japanese Patent Application No. 2001-35559, filed Feb. 13, 2001, the entire disclosure of which is incorporated herein by reference.

BACKGROUND OF THE INVENTION

1. Field of the Invention

This invention relates to a memory control circuit capable for use in a data transmitting device for sending and receiving data serially.

2. Description of the Related Art

A personal computer (PC) includes a data transmitting device for transferring data with an external device. The data transmitting device includes memories, which store data to be sent to the external device, based on an instruction from a central processing unit (CPU) in the PC, and which store data being sent from the external device. The data in the memories, which was stored by the request of the CPU, is read-out in response to a read-out request from the external device. Also, the data in the memories, which was sent from the external device, is read-out in response to a read-out request from the CPU.

A dual port random access memory (DP-RAM) is used as the memory in the data transmitting device. Generally, to increase its transmitting speed and its transmission efficiency, the data transmitting device may have two DP-RAMs. One is for sending data from the external device, and the other is for receiving data from the external device.

Referring to FIG. 5, the data transmitting circuit having two DP-RAMs is illustrated. The first DP-RAM 1 is used for sending data stored therein, and the second DP-RAM 3 is used for receiving data to be stored therein.

The first DP-RAM includes an enable terminal CENA, an address terminal AA, and a data terminal DA. When the first DP-RAM 1 receives an access request signal CWE from the CPU at its enable terminal CENA, data CWD to be sent, which was received at the data terminal DA, is written and stored in a memory cell at an address, which is designated by an address signal CWA received at the address terminal AA. Further, the first DP-RAM 1 includes an enable terminal CENB, an address terminal AB, and data terminal QB. When the first DP-RAM 1 receives an access request signal ERE from the external device at its enable terminal CENB, data stored in a memory cell at an address designated by an address signal ERA received at the address terminal AB, is read-out. A read-out data ERD is outputted from the data terminal QB to the external device.

The second DP-RAM 3 includes an enable terminal CENB, an address terminal AB, and a data terminal DB. When the second DP-RAM 3 receives an access request signal EWE from the external device at its enable terminal CENB, data EWD to be sent, which was received at the data terminal DB, is written and stored in a memory cell at an address, which is designated by an address signal EWA received at the address terminal AB. Further, the second DP-RAM 3 includes an enable terminal CENA, an address terminal M, and data terminal QA. When the second DP-RAM 3 receives an access request signal CRE from the CPU at its enable terminal CENA, data stored in a memory cell at an address, which is designated by an address signal CRA received at the address terminal M, is read-out. A read-out data CRD is outputted from the data terminal QA to the CPU.

It is possible to use two single port RAMs (SP-RAMs) instead of one DP-RAM. Referring to FIG. 6, the data transmitting circuit includes a first circuit 20 for sending data and a second circuit 30 for receiving data. Each of the first and second circuits 20, 30 includes two SP-RAMs. In FIG. 6, the detail of the second circuit 30 omitted for the sake of brevity because circuit elements and their connections of the second circuit 30 are similar to these in the first circuit 20.

In FIG. 6, the first circuit 20 includes a first SP-RAM 11, a second SP-RAM 13, an inverter 29 and first through fifth selection circuits 21, 23, 25, 27, 15. The first SP-RAM 11 receives data CWD, which should be sent to an external device, at its data terminal D. The first and third selection circuits 21, 25 receive an address signal CWA and an address signal ERA. The address signal CWA designates an address of the memory cell in which data to be send to the external device is written in response to a request from a CPU. The address signal ERA designates an address of the memory cell in which data should be read-out to the external device.

The second and fourth selection circuits 23, 27 receive an access request signal CWE from the CPU and an access request signal ERE from the external device. The fifth selection circuit 15 is connected to the first and second SP-RAMs 11, 13 for receiving their output signals, which are outputted from their output terminals Q. In response to the logic level of a bank signal BT, one of SP-RAMs 11, 13 write data to be sent to the external device, and the other reads-out data to the external device. The bank signal BT is inputted to the first and second selection circuits 21, 23, and is inputted to the third through fifth selection circuits via the inverter 29.

According to the first circuit 20, when the bank signal BT is at an H level corresponding to the power supply voltage level, the first and second selection circuits select the address signal CWA and the access request signal CWE, respectively. The selected signals CWA, CWE are inputted respectively to an address terminal A and to an enable terminal CEN of the first SP-RAM 11. Therefore, in response to the request from the CPU, the data signal CWD being inputted at the data terminal D is written in the memory cell designated by the address signal CWA, as data to be sent to the external device.

Further, when the bank signal BT is at the H level, the third and fourth selection circuits 25, 27 select the address signal ERA and the access request signal ERE, respectively. The selected signals ERA, ERE are inputted respectively to an address terminal A and to an enable terminal CEN of the second SP-RAM 13. Therefore, in response to the request from the external device, data in the memory cell designated by the address signal ERA, is read-out and outputted from the output terminal Q of the second SP-RAM 13 to the fifth selection circuit 15. When the bank signal BT is at the H level, the fifth selection circuit 15 selects the output signal from the output terminal Q of the second SP-RAM 13. The selected data is outputted from the fifth selection circuit 15 to the external device as the read-out data ERD.

When the bank signal BT is at an L level corresponding to the ground voltage level, the first and second selection circuits 21, 23 select and output the address signal ERA and the access request signal ERE, respectively. Further, when the bank signal BT is at the L level, the third and fourth selection circuits 25, 27 select and output the address signal CWA and the access request signal CEW, respectively. Therefore, while the bank signal BT is at the L level, the first SP-RAM 11 acts for reading-out data to the external device, and the second SP-RAM 13 acts for writing data to be sent to the external device. When the bank signal BT is at the L level, the fifth selection circuit 15 selects the output signal from the output terminal Q of the first SP-RAM 11. The selected data is outputted from the fifth selection circuit 15 to the external device as the read-out data ERD.

The operation of the second circuit 30 for receiving data is similar to that of the first circuit 20 for sending data. That is, in response to the logic level of the bank signal BR, selection circuits formed in the second circuit select one of two following conditions; the first condition is to send the access request signal CRE and address signal CRA, which are based on the read-out request from the CPU, to first and second RAMs, and the second condition is to send the access request signal EWE and address signal EWA, which are based on the writing request from the external device, to the first and second RAMs. Then, data in the RAM that the access request signal CRE and address signal CRA are received is outputted as the read-out data CRD.

However, according to the data transmitting circuit shown in FIG. 5, since two DP-RAMs, which have very unique characteristics, are used, the occupancy of the DP-RAMs on the semiconductor device is high. Therefore, when the data transmitting circuit is formed on one-chip device as the integrated circuit, the size of the one-chip device also becomes large. Further, since the DP-RAM is generally expensive, it is inevitable that the data transmitting circuit having two DP-RAMs is expensive. Moreover, the power consumption of the DP-RAM is larger than that of the regular RAM. Therefore, when two DP-RAMs are used, a low power consumption characteristic can not be expected.

According to the data transmitting circuit shown in FIG. 6, since four SP-RAMs are used, the chip size of the semiconductor device having them becomes large, and the data transmitting circuit having four SP-RAMs is expensive. The power consumption of the SP-RAM is lower than that of the DP-RAM. However, when four SP-RAMs are used, the total power consumption of them becomes very large. Therefore, a low power consumption characteristic can not be expected to the data transmitting circuit having four SP-RAMs.

SUMMARY OF THE INVENTION

It is therefore an object of the invention to resolve the above-described problem in a data transmitting circuit and provide a memory control circuit formed in the data transmitting circuit having a low power consumption characteristic with small and low cost.

The object is achieved by a memory control circuit enabling a memory to be accessed from a first processing device in response to a first processing request signal, and enabling the memory to be accessed from a second processing device in response to a second processing request signal. The memory control circuit includes a watching circuit, which receives the first and second processing request signal, the watching circuit observing, based on these signals, whether the first and second processing device requests for accessing to the memory, an address generating circuit generating and outputting a first address signal in response to the first processing request signal, and generating a second address signal in response to the second processing request signal, a selection circuit, which is responsive to a selection signal, outputting one of the first and second address signals to the memory, and a control circuit generating the selection signal, the control circuit outputting the selection signal for selecting the first address signal prior to the second address signal when the observations of the watching circuit indicates that both of the first and second processing device request for accessing to the memory.

Further, the object is achieved by another memory control circuit enabling a memory to be accessed from a first processing device in response to a first or a second processing request signal, and enabling the memory to be accessed from a second device in response to a third or a fourth processing request signal. This memory control circuit includes a first group of watching circuits observing whether both of the first and second processing device request for accessing to the memory, based on the first and second processing request signal and the third processing request signal, a second group of watching circuits observing whether both of the first and second processing device request for accessing to the memory, based on the first and second processing request signal and the signal representing observation of the first watching circuit and the third processing request signal, an address generating circuit generating and outputting a first address signal in response to the first processing request signal, a second address signal in response to the second processing request signal, a third address signal in response to the third processing request signal, and a fourth address signal in response to the fourth processing request signal, a selection circuit, which is responsive to a selection signal, outputting one of the first through fourth address signals to the memory, and a control circuit generating the selection signal, the control circuit outputting the selection signal for selecting the first or second address signal prior to the third or fourth address signal when the signal representing the observation of the first or second watching circuit indicates that both of the first and second processing devices request for accessing to the memory.

According to the memory control circuit described above, when two processing devices request for accessing to the memory simultaneously, one of the two requests can be carried out prior to the other. As a result, it is possible to control the processing requests, which was inputted simultaneously. Therefore, it is not necessary to use either any expensive DP-RAMs or a plurality of the regular RAMs, in order to achieve the object described above.

Further, to achieve the object, each of the watching circuits may hold the result of the observations temporarily, and the control circuit may set the priority on the processing request signals for carrying out their task. The priority of the processing request signals is determined by their task.

The above and further objects and novel features of the invention will more fully appear from the following detailed description, appended claims and accompanying drawings.

DETAILED DESCRIPTION OF THE PREFERRED EMBODIMENTS

First Preferred Embodiment

Figure 1:
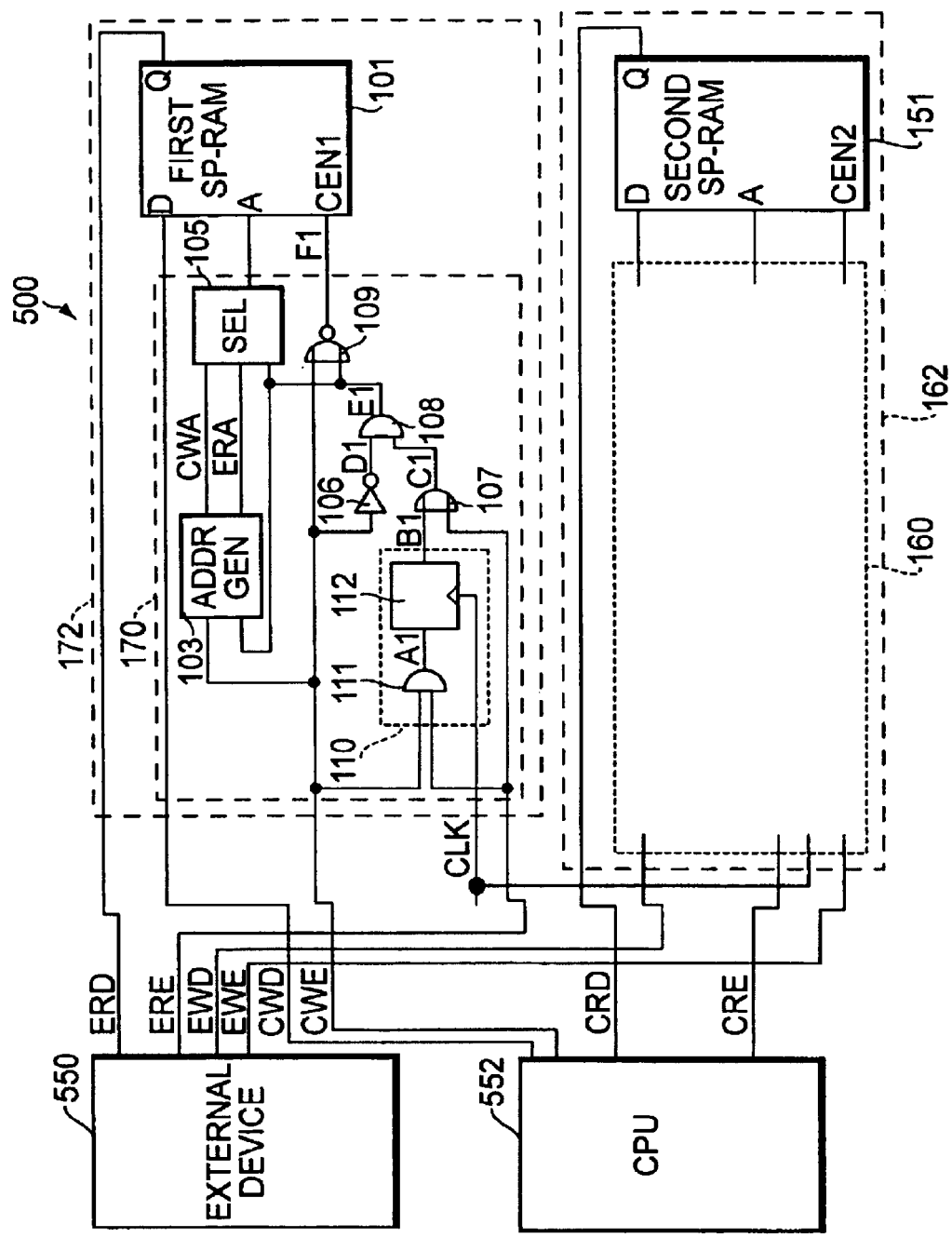
FIG. 1 is a circuit diagram of a data transmitting circuit having memory control circuits according to a first embodiment of the invention.

Referring to FIG. 1, a data transmitting circuit 500 includes a first circuit 172 for sending data and a second circuit 162 for receiving data. The first circuit 172 includes a first memory control circuit 170 and a first single port RAM (SP-RAM) 101. Similarly, the second circuit 162 includes a second memory control circuit 160 and a second single port RAM (SP-RAM) 151. In this embodiment, since the second memory control circuit 160 is very similar to the first memory control circuit 170, a detail explanation of the second memory control circuit 160 would be redundant and therefore is omitted.

The first memory control circuit 170 includes an address generating circuit 103, a selection circuit 105, a watching circuit 110, an inverter 106, an OR gate 107, an AND gate 108 and a NOR gate 109. The inverter 106, the OR gate 107, the AND gate 108 and the NOR gate 109 function as a control circuit.

The address generating circuit 103 receives an access request signal CWE (a first processing request signal) from a CPU 552 (a first processing device) for requesting to write data, and then generates and outputs an address signal CAW designating an address of the memory cell in which data should be stored to the selection circuit 105. The address generating circuit 103 also receives an output signal E1 from the AND gate 108, which is generated from an access request signal ERE (a second processing request signal) sent from an external device 550 (a second processing device) for requesting to read-out data, and then, generates and outputs an address signal ERA designating an address of the memory cell in which data to be read-out is stored, to the selection circuit 105. According to FIG. 1, when the logic level of the access request signal CWE is changed to an H level, it is meant that accessing to the SP-RAM 101 by the CPU 552 is requested. Also, when the logic level of the access request signal ERE is changed to an H level, it is meant that accessing to the SP-RAM 101 by the external device 550 is requested. Accordingly, the address signal CWA is renewed in response to the change of the logic level of the access request signal CWE from the H level to the L level, and the address signal ERA is renewed in response to the change of the logic level of the access request signal ERE from the H level to an L level.

The selection circuit 105 selects one of two address signals CWA, ERA in response to the output signal E1, and outputs the selected address signal to an address terminal A of the SP-RAM 101. According to the data transmitting circuit 500 in FIG. 1, when the logic level of the output signal E1 is at the L level, the address signal CWA is selected. On the other hand, when the logic level of the output signal E1 is at the H level, the address signal ERA is selected.

The watching circuit 110 includes an AND gate 111 and a holding circuit 112 such as a D-type flip-flop circuit. The AND gate 111 receives two access request signals CWE and ERE, and outputs an output signal A1 as the result of the logical product of two access request signals CWE and ERE. The holding circuit 112 receives a clocked signal CLK, and outputs an output signal B1 having a logic level corresponding to the logic level of the output signal A1 when the clocked signal CLK rises, and the holding circuit 112 maintains the logic level of the output signal B1. In other words, the watching circuit 110 observes whether or not both of the CPU 552 and the external device 550 request the access to the RAM 101, namely, whether or not the logic level of both the access request signals CWE, ERE is at the H level. When the logic level of both the access request signals CWE, ERE is at the H level, the watching circuit 110 outputs the output signal B1 having the H level when the clock signal CLK rises, and holds the logic level of the output signal B1. On the other hand, when the logic level of one of or both of the access request signals CWE, ERE is at the L level, the watching circuit 110 outputs the output signal B1 having the L level when the clock signal CLK rises, and holds the logic level of the output signal B1.

The OR gate 107 receives the access request signal ERE and the output signal B1, and outputs an output signal C1 as the result of the logical sum of these signals. The AND gate 108 receives the output signal C1 and an output signal D1, which is inverted from the access request signal CWE by the inverter 106, and outputs the output signal E1 as the result of the logical product of these signals. The NOR gate 109 receives the output signal E1 and the access request signal CWE, and outputs an output signal F1 as the result of the contradiction logical sum of these signals to an enable terminal CEN1 of the SP-RAM 101.

According to control circuit having these logic circuits, the following control operation is carried out. When the logic level of the access request signal CWE is at the H level and the logic level of the access request signal ERE is at the L level, the logic level of the output signal F1 is at the L level because the logic level of the output signal E1 is fixed to the L level. According to the data transmitting circuit 500, while the output signal F1 having the L level is inputted to the enable terminal CEN1, the SP-RAM 101 is enabled. Therefore, it is possible to access the SP-RAM 101. On the other hand, while the output signal F1 having the H level is inputted to the enable terminal CEN1, the SP-RAM 101 is disabled. Therefore, it is impossible to access the SP-RAM 101. Accordingly, in response to the logic level of the access request signal CWE, the SP-RAM 101 is enabled, and then data CWD, which is inputted to a data terminal D of the SP-RAM 101, is written in a memory cell, which is designated by the address signal CWA outputted from the selection circuit 105.

When the logic level of the access request signal CWE is at the L level and the logic level of the access request signal ERE is at the H level, the logic level of the output signals C1, D1 is at the H level. Thus, the logic level of the output signal E1 is at the H level. Accordingly, in response to the logic level of the access request signal ERE, the SP-RAM 101 is enabled, and then data, which is stored in a memory cell, which is designated by the address signal ERA outputted from the selection circuit 105, is read-out, and the read-out data RED is outputted from a data output terminal D of the SP-RAM 101 to the external device 550.

When the logic level of both access request signals CWE, ERE is at the H level, the logic level of the output signal C1 is at the H level as the result of the logical operation of the watching circuit 110. However, since the output signal D1 having the L level is inputted to the AND gate 108, the logic level of the output signal E1 is maintained at the L level. Similar to the state that the access request signal CWE is at the H level and the access request signal ERE is at the L level, the output signal E1 having L level is inputted to the address generating circuit 103, the selection circuit 109 and the NOR gate. Therefore, the access request from the CPU 552 is prior to that from the external device 550. So, in response to the access request signal CWE, the SP-RAM 101 is enabled, and then data CWD, which is inputted to a data terminal D of the SP-RAM 101, is written in a memory cell designated by the address signal CWA outputted from the selection circuit 105.

After that, even if the logic level of the access request signal ERE is changed to the L level, the logic level of the output signal B1 from the watching circuit 110 is maintained at the H level for one clock cycle because the output signal A1 is held at the holding circuit 112. Thus, when the logic level of the access request signal CWE is changed to the L level after the SP-RAM 101 is accessed by the request from the CPU 552, the logic level of the output signal E1 is changed to the H level. Therefore, in response to the logic level of the access request signal ERE, the SP-RAM 101 is enabled, and then data, which is stored in a memory cell designated by the address signal ERA outputted from the selection circuit 105, is read-out, and the read-out data RED is outputted from the data output terminal D of the SP-RAM 101 to the external device 550.

When the logic level of both the access request signals CWE, ERE is at the L level, the logic level of the output signal F1 is at the H level. Thus, it is impossible to access the SP-RAM 101.

According to the first memory control circuit 170 of the first embodiment, when the access request signals CWE, ERE from the CPU 552 and from the external device 550 are inputted, the high priority request (ex. the access request signal CWE in this embodiment) can be carried out prior to the low priority request (ex. the access request signal ERE in this embodiment), and then, the low priority request can be carried out. Thus, the data writing request from the CPU 552 to the memory and the data read-out request from the external device 550 to the memory can be performed by a single SP-RAM 101. Therefore, it is possible to reduce power consumption, to reduce the chip size, and to reduce the cost. Specifically, since the control operation described above can be expected to be performed by a few circuit elements, the complicated control is not required. Thus, it is highly expected to reduce the chip size and the cost.

Next, the detail operation of the first memory control circuit 170 is explained with reference to an operation time chart shown in FIG. 2.

Figure 2:
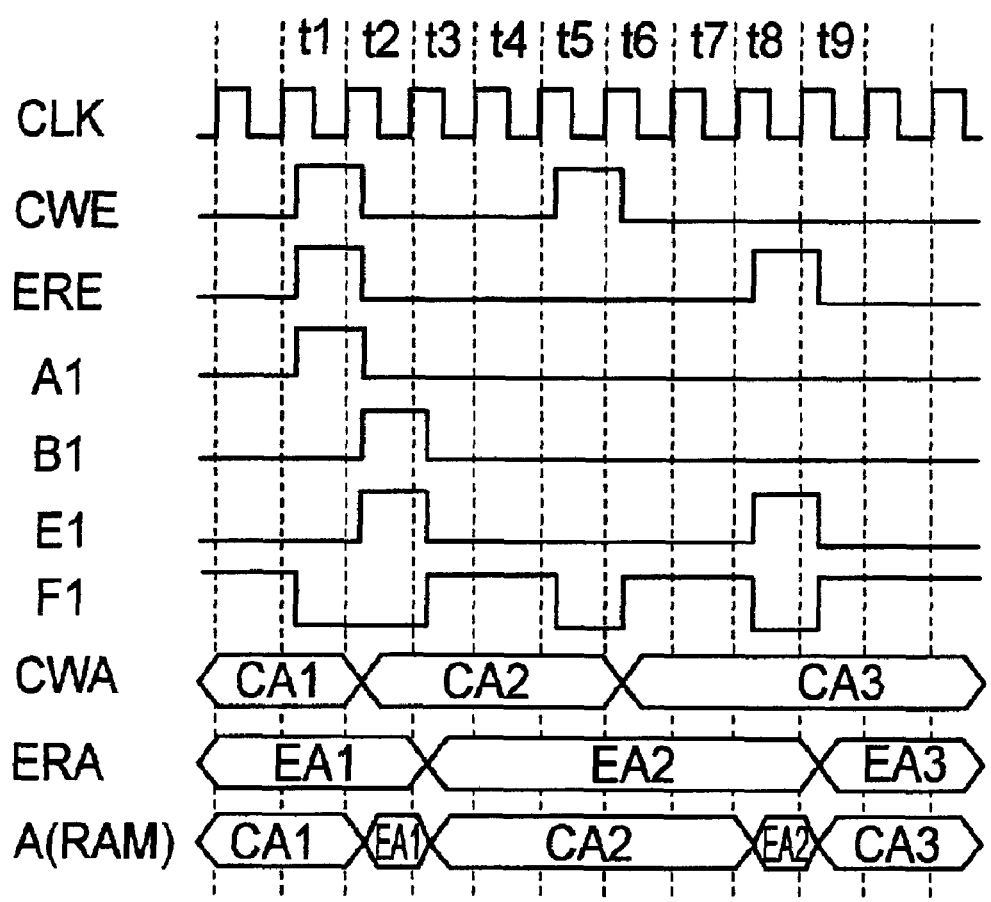
FIG. 2 is a timing chart showing the operation of the data transmitting circuit of FIG. 1.

In FIG. 2, as an initial state, the logic level of both access request signals CWE, ERE is at the L level since both of the CPU 552 and the external device 550 do not send any requests to access the SP-RAM 101. Therefore, the logic level of the output signals A1, B1, C1, E1 is at the L level, and the logic level of the output signals D1, F1 is at the H level. Thus, the disable condition of the SP-RAM 101 is maintained.

During time t1, the logic level of both access request signals CWE, ERE is changed to the H level, the logic level of the output signal A1 is changed to the H level, and the logic level of the output signal F1 is changed to the L level. Since the watching circuit 110 has not yet held the output signal A1 in its holding circuit 112, the logic level of the output signal B1 is still at the L level. Further, since the logic level of the output signal D1 is changed to the L level because the logic level of the access request signal having the H level is inverted by the inverter 106, the logic level of the output signal E1 is maintained at the L level. Therefore, during time t1, based on the request from the CPU 552, the access to the SP-RAM 101 for writing data in a memory cell at an address CA1 is carried out.

During time t2, the process for writing data in the SP-RAM 101, based on the request from the CPU 552, has been completed, and then, the logic level of the access request signals CWE, ERE is changed to the L level. Accordingly, although the logic level of the output signal A1 is changed to the L level, the logic level of the output signal B1 is changed to the H level when the clock signal rises during time t2 because the output signal A1 is held in the holding circuit 112. Since the logic level of the output signal D1 is changed to the H level after the logic level of the access request signal CWE is changed to the L level, the logic level of the output signal D1 is changed to the H level. So, the logic level of the output signal F1 is maintained at the L level. Therefore, during time t2, based on the request from the external device 550, the process for reading-out data from the memory cell designated by the address signal EA1, is carried out. Here, in response to the change of the logic level of the access request signal CWE to the L level, the address generating circuit 103 generates new address signal CWA, and the new address signal CWA indicates new address CA2.

After that, the process for reading-out data from the SP-RAM 101, based on the request from the external device 550, has been completed, and then, the logic level of the output signal B1 from the holding circuit 112 is changed to the L level when the clock signal rises during time t3. Thus, since the logic level of the output signal E1 is changed to the L level, the first memory control circuit 170 returns to the initial state. Here, in response to the change of the logic level of the output signal E1 to the L level, the address generating circuit 103 generates new address signal ERA, and the new address signal ERA indicates new address EA2.

During time t5, the logic level of the access request signal CWE is changed to H level. Since the logic level of the access request signal ERE is maintained at the L level, the logic level of the output signal C1 is maintained at the L level. Thus, the logic level of the output signal E1 is maintained at the L level, and the logic level of the output signal F1 is changed to the L level. Accordingly, during time t5, based on the request from the CPU 552, the access to the SP-RAM 101 for writing data in a memory cell at an address CA2 is carried out.

During time t6, the process for writing data in the SP-RAM 101, based on the request from the CPU 552, has been completed, and then, the logic level of the access request signal CWE is changed to the L level. Thus, the address generating circuit 103 generates another new address signal CWA, and this new address signal CWA indicates new address CA3.

During time t8, the logic level of the access request signal ERE is changed to the H level. Since the logic level of the access request signal CEW is maintained at the L level, the logic level of the output signal C1 is changed to the H level. Thus, the logic level of the output signal E1 is changed to the H level. Accordingly, during time t8, based on the request from the external device 550, the access to the SP-RAM 101 for reading-out data in a memory cell at an address EA2 is carried out.

During time t9, the process for reading-out data from the SP-RAM 101, based on the request from the external device 550, has been completed, and then, the logic level of the access request signal ERE is changed to the L level. Thus, the address generating circuit 103 generates another new address signal ERA, and this new address signal ERA indicates new address EA3.

As described above, according to the first memory control circuit 170, when the access request signals CWE, ERE from the CPU 552 and from the external device 550 are inputted, it is possible to schedule that the high priority request is carried out prior to the low priority request, and then, the low priority request can be carried out later.

In the second memory control circuit 160, as described at the beginning of the description of the first embodiment, the second memory control circuit 160 is very similar to the first memory control circuit 170. So, an access request signal CRE from the CPU 552 for requesting to read-out data from the SP-RAM 151 is applied as a replacement of the access request signal CWE, and an access request signal EWE from the external device 550 for requesting to write data in the SP-RAM 151 is applied as a replacement of the access request signal ERE. Therefore, when both access request signals CRE, EWE are inputted simultaneously, it is possible to control that the process for reading-out data, based on the request from the CPU 552, is carried out prior to the other request, as well as the operation of the first memory control circuit 170.

Second Preferred Embodiment

Figure 3:
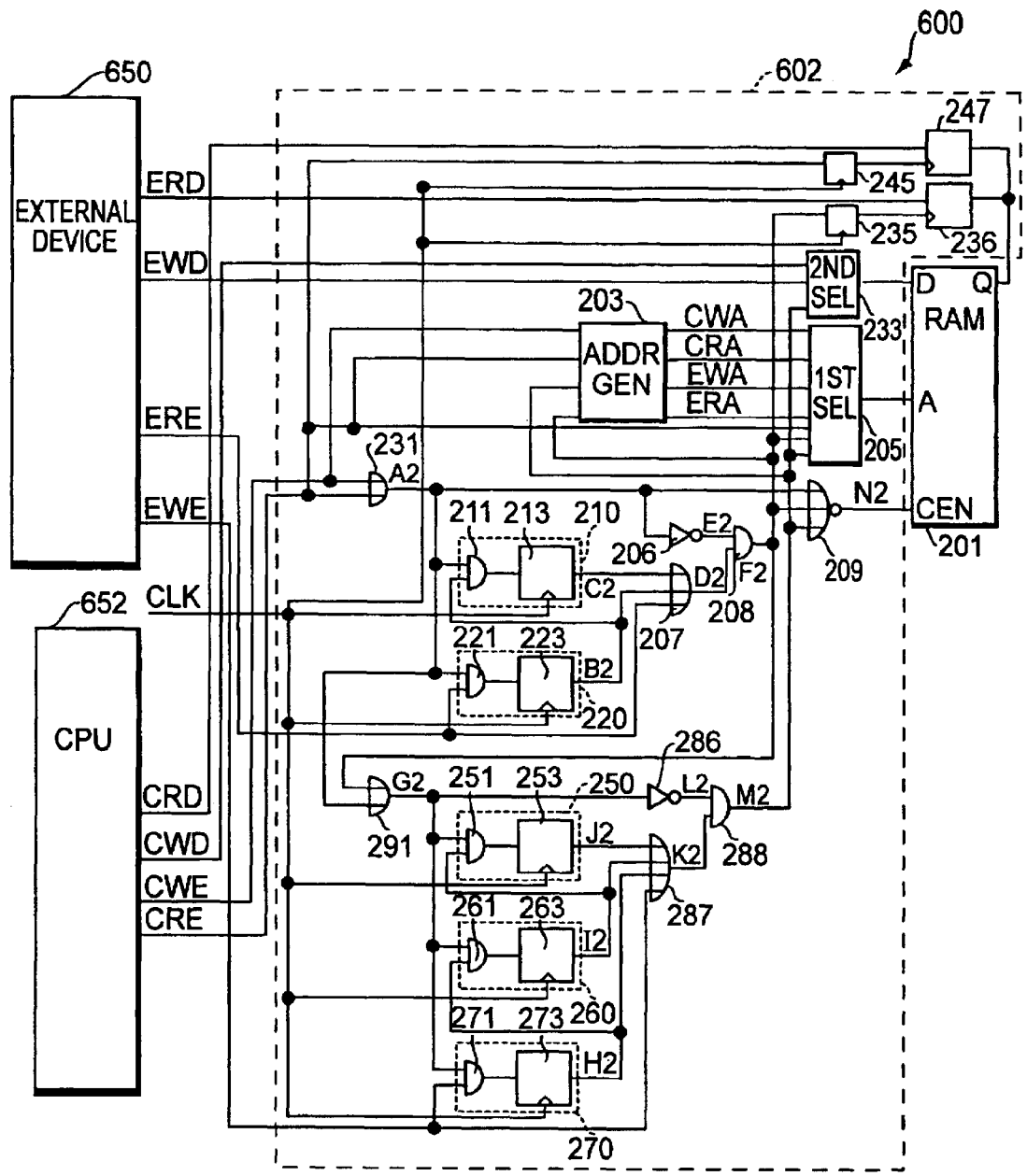
FIG. 3 is a circuit diagram of a data transmitting circuit having memory control circuits according to a second embodiment of the invention.

Referring to FIG. 3, a data transmitting circuit 600 including a memory control circuit 602 is illustrated. In FIG. 3, as well as the SP-RAM 101 in the FIG. 1, a single port random access memory (SP-RAM) 201 is used. Further, as well as the SP-RAM 101 in the FIG. 1, the SP-RAM 201 is enabled and accessible when a signal having the L level is inputted to an enable terminal CEN. Further, access request signals CWE, CRE, ERE, EWE in FIG. 3 as the first through fourth process request signal are the same as the access request signals CWE, CRE, ERE, EWE in FIG. 1. In the following explanation, it is presupposed that the access request signals CWE, CRE are never generated from a CPU 652 simultaneously. In the second embodiment, a single SP-RAM 201 are commonly used for a first circuit (a combination of a circuit that receives the access request signals CRD, EWD, CRE, EWE and a circuit that receives signals from the circuit) for sending data and a second circuit (a combination of a circuit that receives the access request signals ERD, CWD, ERE, CWE and a circuit that receives signals from the circuit) for receiving data.

The memory control circuit 602 includes an address generating circuit 203, first and second selection circuits 205, 233, first through fifth watching circuits 210, 220, 250, 360, 270, first through fourth OR gates 207, 231, 287, 291, first and second AND gates 208, 288, first and second inverters 206, 286, a NOR gate 209 and first through fourth holding circuits, such as D-type flip-flop circuits.

The address generating circuit 203 receives the access request signals CWE, CRE, and generate an address signal CWA, which is requested from the CPU 652 to write data, and generated an address signal CRA, which is requested from the CPU 652 to read-out data. The address signals CWA, CRA are renewed when the logic level of the address signals CWA, CRE is changed from the H level to the L level. The address generating circuit 203 also receives an output signal M2 from the second AND gate 288, and generates an address signal EWA, which is requested from an external device 650 to write data. The address signals EWA is renewed when the logic level of the output signal M2 is changed from the H level to the L level. Further, The address generating circuit 203 receives an output signal F2 from the first AND gate 208, and generates an address signal ERA, which is requested from an external device 650 to read-out data. The address signals ERA is renewed when the logic level of the output signal F2 is changed from the H level to the L level.

The second selection circuit 233 receives data CWD to be written in response to the request from the CPU 652 and data EWD to be written in response to the request from the external device 650. The second selection circuit 233 selects one of the data CWD, EWD in response to the logic level of the output signal M2, and outputs the selected data to an data input terminal D of the SP-RAM 201. In the memory control circuit 602 in FIG. 3, when the logic level of the output signal M2 is at the L level, data CWD is selected. When the logic level of the output signal M2 is at the H level, data EWD is selected.

The first selection circuit 205 receives the address signals CWA, CRA EWA, ERA, and selects one of them in response to the logic level of the access request signal CWE, the output signal F2 and the output signal M2. The selected address signal are outputted to an address terminal A of the SP-RAM 201. In the memory control circuit 602, when the logic level of the access request signal CWE, the output signal F2 and the output signal M2 is at the L level, the address signal CWA is selected. When the logic level of the access request signal CWE is at the H level and the logic level of the output signals F2, M2 is the L level, the address signal CRA is selected. When the logic level of the output signal F2 is at the H level and the logic level of the output signal M2 and the access request signal CWE is the L level, the address signal ERA is selected. When the logic level of the output signal M2 is at the H level and the logic level of the output signal F2 and the access request signal CWE is the L level, the address signal EWA is selected.

The first holding circuit 235 accepts the output signal F2 when a clock signal CLK rises, and outputs a signal having a logic level corresponding to the logic level of the output signal F2, and maintains it. The second holding circuit 236 accepts an signal outputted from an output terminal Q of the SP-RAM 201 in response to the change of the logic level of the signal from the first holding circuit 235. In this embodiment, the second holding circuit 236 accepts the signal from the output terminal Q when the logic level of the signal from the first holding circuit 235 is changed to the H level. The second holding circuit 236 outputs a signal having a logic level corresponding to the logic level of the signal from the output terminal Q, and maintains it. The signal outputted from the second holding circuit 236 is data ERD, which is read-out from the SP-RAM 201, based on the request from the external device 650.

The third holding circuit 235 accepts the access request signal CRE when a clock signal CLK rises, and outputs a signal having a logic level corresponding to the logic level of the access request signal CRE, and maintains it. The fourth holding circuit 247 accepts the signal outputted from the output terminal Q of the SP-RAM 201 in response to the change of the logic level of the signal from the third holding circuit 245. In this embodiment, the fourth holding circuit 246 accepts the signal from the output terminal Q when the logic level of the signal from the third holding circuit 245 is changed to the H level. The fourth holding circuit 246 outputs a signal having a logic level corresponding to the logic level of the signal from the output terminal Q, and maintains it. The signal outputted from the fourth holding circuit 246 is data CRD, which is read-out from the SP-RAM 201, based on the request from the CPU 652.

The second OR gate 231 receives two access request signals CWE, CRE. The access request signal CWE is a request from the CPU 652 that data be written in the SP-RAM 201, and the access request signal CRE is a request from the CPU 652 that data be read-out from the SP-RAM 201. Therefore, a logic level of an output signal A2 from the second OR gate 231 is at the H level when the access request to the SP-RAM 201 from the CPU 652 for writing or reading-out data is inputted to the memory control circuit 602. The logic level of the output signal A2 is maintained at the L level when the CPU 652 does not send any access requests to the memory control circuit 602.

The first watching circuit 210 includes an AND gate 211 and a holding circuit 213. The AND gate 211 receives the output signal A2 and an output signal B2, which is outputted from the second watching circuit 220. The holding circuit 213 accepts a signal outputted from the AND gate 211 when the logic level of the clock signal CLK is changed (in this embodiment, when the logic level of the clock signal CLK is changed to the H level), and outputs an output signal C2 having a logic level corresponding to the logic level of the signal outputted from the AND gate 211. The second watching circuit includes an AND gate 221 and a holding circuit 223. The AND gate 221 receives the output signal A2 and the access request signal ERE. The holding circuit 213 accepts a signal outputted from the AND gate 221 when the logic level of the clock signal CLK is changed (in this embodiment, when the logic level of the clock signal CLK is changed to the H level), and outputs the output signal B2 having a logic level corresponding to the logic level of the signal outputted from the AND gate 221.

The first OR gate 207 receives the output signal B2, the output signal C2, and the access request signal ERE. When the logic level of the output signal B2, the output signal C2, and the access request signal ERE is at the L level, the first OR gate 207 outputs an output signal D2 having the L level to the first AND gate 208. When the logic level of one of the output signal B2, the output signal C2, and the access request signal ERE is at the H level, the first OR gate 207 outputs the output signal D2 having the H level to the first AND gate 208.

The first and second watching circuits 210, 220 and the first OR gate 207 perform the following operation. When the logic level of the output signal A2 is at the L level, namely the CPU 652 does not request for accessing to the SP-RAM 201, the logic level of the output signals B2, C2 is maintained at the L level if the external device 650 does not request for accessing to the SP-RAM 201 to read-out data (namely, if the logic level of the access request signal ERE is at the L level). Therefore, the logic level of the output signal D2 from the first OR gate 207 is at the L level. Even if the logic level of the access request signal ERE is changed to the H level (namely, the external device 650 requests for accessing to the SP-RAM 201 to read-out data) under the condition that the logic level of the output signal A2 is maintained at the L level, the logic level of the output signals from the AND gates 211, 221 to the holding circuits 213, 223 is maintained at the L level. However, the logic level of the output signal D2 is changed to the H level in response to the access request signal ERE having the H level.

Next, when the logic level of the output signal A2 is changed to the H level (namely, the CPU 652 requests for accessing to the SP-RAM 201) under the condition that the logic level of the access request signal ERR is maintained at the L level, the logic level of the output signals B2, C2 is maintained at the L level. Therefore, the logic level of the output signal D2 is maintained at the L level.

If the logic level of the access request signal ERE is at the H level while the logic level of the output signal A2 is at the H level (namely, the CPU 652 requests for accessing to the SP-RAM 201 and the external device 650 requests for accessing to the SP-RAM 201 to read-out the data), the following operation is carried out. When the logic level of the output signal A2 and the access request signal ERE is changed to the H level in a first clock cycle, the logic level of the signal from the AND gate 221 of the second watching circuit 220 is changed to the H level in this clock cycle, then, the logic level of the output signal B2 is changed to the H level from the L level when the clock signal rises in a second clock cycle subsequent to the first clock cycle. Thus, if the logic level of the access request signal ERE returns to the L level in the second clock cycle, the logic level of the output signal D2 is at the H level because the logic level of the output signal B2 is changed to the H level in the second clock cycle. In other words, the change of the logic level of the access request signal ERE from the L level to the H level does not change the logic level of the output signal D2 immediately, and makes the change of the logic level of the output signal D2 delay for one clock cycle.

If the output signal A2 having the H level lasts for two clock cycles, that is, requests from the CPU 652 for accessing to the SP-RAM 201 to write data and to read-out data are made successively, the following operation is carried out. As described above, the logic level of the output signal B2 from the second watching circuit 220 is changed to the L level from the H level at the second clock cycle. But, the logic level of the output signal C2 is maintained at the L level at this clock cycle. Then, when the first watching circuit 210 accepts the output signal B2 in response to the rise of the clock signal at the third clock cycle subsequent to the second clock cycle, the logic level of the output signal C2 is changed to the H level from the L level. Thus, in the third clock cycle, if the logic level of the output signal B2 returns to the L level, the logic level of the output signal D2 is at the H level because the logic level of the output signal C2 is changed to the H level. In other words, the change of the logic level of the access request signal ERE from the L level to the H level does not change the logic level of the output signal D2 immediately, and makes the change of the logic level of the output signal D2 delay for two clock cycles.

As described above, the first and second watching circuits 210, 220 and the first OR gate 207 generates the output signal D2 having the logic level corresponding to the logic level of the access request signal ERE when the CPU 652 does not request for accessing to the SP-RAM 201. Further, the first and second watching circuits 210, 220 and the first OR gate 207 make the rise of the logic level of the output signal D2, based on the access request signal ERE, delay for one or two clock cycles in response to the period for the access request to the SP-RAM 201 by the CPU 652.

The first AND gate 208 receives the output signal D2 and an output signal E2 outputted from the first inverter 206, which inverts the logic level of the output signal A2. Thus, the logic level of the output signal F2 from the first AND gate 208 is at the L level when the level of the output signal A2 is at the H level (when the CPU 652 requests for accessing to the SP-RAM 201). When the logic level of the output signal A2 is at the L level (when the CPU 652 does not request for accessing to the SP-RAM 201), the logic level of the output signal F2 is at the H level if the logic level of the access request signal ERE is at the H level (if the external device 650 request for accessing to the SP-RAM 201 to read-out data), or if the logic level of one the output signals B2, C2 is at the H level (if the request for accessing to the SP-RAM 201 to read-out data from the external device 650 has been accepted). When the logic level of the output signal A2 is at the L level (the CPU 652 does not request for accessing to the SP-RAM 201), and when the logic level of all of the output signals B2, C2 and the access request signal ERE is at the L level (the CPU 652 does not request for accessing to the SP-RAM 201 to read-out data), the logic level of the output signal F2 is at the L level.

The fourth OR gate 291 receives the output signals A2, F2. The task of the fourth OR gate 291 is similar to that of the second OR gate 231. That is, when the CPU 652 does not request for accessing to the SP-RAM 201 (when the logic level of the output signal A2 is at the L level) and when the external device 650 does not request for accessing to the SP-RAM 201 to read-out data within the particular period including the delayed period delayed by the first and second watching circuits 210, 220 (when the logic level of the output signal F2 is at the L level), the fourth OR gate 291 outputs an output signal G2 having the L level. On the other hand, when the logic level of one of the output signals A2, F2 is at the H level (when CPU 652 requests for accessing to the SP-RAM 201 or the external device 650 request for accessing to the SP-RAM 201 to read-out data in the particular period including the delayed period delayed by the first and second watching circuits 210, 220), the fourth OR gate 291 outputs the output signal G2 having the H level.

Each of the third through fifth watching circuits 250, 260, 270 includes an AND gate and a holding circuit. The AND gate 271 of the fifth watching circuit 270 receives the output signal G2 and the access request signal EWE, which is the request from the external device 650 for accessing to the SP-RAM 201 to write data. The holding circuit 273 accepts a signal outputted from the AND gate 271 when the logic level of the clock signal CLK is changed (in this embodiment, when the logic level of the clock signal CLK is changed to the H level), and outputs an output signal H2 having a logic level corresponding to the logic level of the signal outputted from the AND gate 271. The AND gate 261 of the fourth watching circuit 260 receives the output signals G2, F2. The holding circuit 263 accepts a signal outputted from the AND gate 261 when the logic level of the clock signal CLK is changed (in this embodiment, when the logic level of the clock signal CLK is changed to the H level), and outputs an output signal I2 having a logic level corresponding to the logic level of the signal outputted from the AND gate 261. The AND gate 251 of the third watching circuit 250 receives the output signals G2, I2. The holding circuit 253 accepts a signal outputted from the AND gate 251 when the logic level of the clock signal CLK is changed (in this embodiment, when the logic level of the clock signal CLK is changed to the H level), and outputs an output signal J2 having a logic level corresponding to the logic level of the signal outputted from the AND gate 251.

The third OR gate 287 receives the output signals H2, I2, J2 and the access request signal EWE. Therefore, when the logic level of all of the output signals H2, I2, J2 and the access request signal EWE is at the L level, the third OR gate 287 outputs an output signal K2 having the L level. On the other hand, the logic level of one of them is at the H level, the third OR gate 287 outputs the output signal K2 having the H level.

Comparing the circuit including the first and second watching circuits 210, 220 and the first OR gate 207, the circuit including the third through fifth watching circuits 250, 260, 270 and the third OR gate 287 has one additional watching circuit. Therefore, appearing the access request signal ERE on the output signal D2 can be delayed by the first and second watching circuit 210, 220 and the first OR gate 207 for two clock cycles at the maximum. On the other hand, appearing the access request signal EWE on the output signal K2 can be delayed by the third through fifth watching circuit 230, 240, 250 and the third OR gate 287 for three clock cycles at the maximum. More detail operation is explained below.

When the logic level of the output signal G2 is at the L level, that is, when the CPU 652 does not request for accessing to the SP-RAM 201 (when the logic level of the output signal A2 is at the L level) and when the external device 650 does not request for accessing to the SP-RAM 201 to read-out data within the particular period including the delayed period delayed by the first and second watching circuits 210, 220 (when the logic level of the output signal F2 is at the L level), the logic level of the output signals H2, I2, J2 is maintained at the L level. Thus, when the logic level of the access request signal EWE is at the L level, the logic level of the output signal K2 from the third OR gate 287 is at the L level. Then, when the logic level of the access request signal EWE is changed to the H level (when the external device 650 requests for accessing to the SP-RAM 201 to read-out data), the logic level of the output signal K2 from the third OR gate 287 is changed to the H level in response to the change of the logic level of the access request signal EWE.

Next, when the logic level of the output signal G2 is at the H level, that is, when the CPU 652 requests for accessing to the SP-RAM 201 (when the logic level of the output signal A2 is at the H level) or when the external device 650 requests for accessing to the SP-RAM 201 to read-out data within the particular period including the delayed period delayed by the first and second watching circuits 210, 220 (when the logic level of the output signal F2 is at the H level), the logic level of the output signals H2, I2, J2 is maintained at the L level if the logic level of the access request signal EWE is maintained at the L level.

If the logic level of the access request signal EWE is at the H level while the logic level of the output signal G2 is at the H level (namely, the CPU 652 requests for accessing to the SP-RAM 201 or the external device 650 requests for accessing to the SP-RAM 201 to read-out data in the period including the delayed period, and the external device 650 requests for accessing to the SP-RAM 201 to write data), the following operation is carried out. First, the logic level of the signal outputted from the AND gate 271 of the fifth watching circuit 270 is changed to the H level in a first clock cycle, then, the logic level of the output signal H2 is changed to the H level from the L level when the clock signal rises in a second clock cycle subsequent to the first clock cycle. Thus, if the logic level of the access request signal EWE returns to the L level in the second clock cycle, the logic level of the output signal K2 can be changed to the H level in the second clock cycle because the logic level of the output signal H2 is changed to the H level in the second clock cycle. In other words, the change of the logic level of the access request signal EWE from the L level to the H level does not change the logic level of the output signal K2 immediately, and makes the change of the logic level of the output signal K2 delay for one clock cycle.

If the output signal G2 having the H level lasts for two clock cycles, that is, requests from the CPU 652 for accessing to the SP-RAM 201 to write data and to read-out data are made successively or the request from the CPU 652 for accessing to the SP-RAM 201 followed by the request from the external device 650 for accessing to the SP-RAM 201 to read-out data is made, the following operation is carried out. As described above, the logic level of the output signal H2 from the watching circuit 270 is changed to the H level from the L level in the second clock cycle. But, the logic level of the output signal I2 is maintained at the L level at this clock cycle. Then, when the fourth watching circuit 260 accepts the output signal H2 in response to the rise of the clock signal at the third clock cycle subsequent to the second clock cycle, the logic level of the output signal I2 is changed to the H level from the L level. Thus, if the logic level of the output signal H2 returns to the L level in the third clock cycle, the logic level of the output signal K2 is at the H level because the logic level of the output signal I2 is changed to the H level in the third clock cycle. In other words, the change of the logic level of the access request signal ERE from the L level to the H level does not change the logic level of the output signal I2 immediately, and makes the change of the logic level of the output signal I2 delay for two clock cycles.

Further, If the output signal G2 having the H level lasts for three clock cycles, that is, the requests from the CPU 652 for accessing to the SP-RAM 201 to write data and to read-out data are made successively and then, the delayed request from the external device 650 for accessing to the SP-RAM 201 to read-out data is made, the following operation is carried out. As described above, the logic level of the output signal I2 from the fourth watching circuit 260 is changed to the H level from the L level at the third clock cycle. But, the logic level of the output signal J2 is maintained at the L level at this clock cycle. Then, when the third watching circuit 250 accepts the output signal I2 in response to the rise of the clock signal at the fourth clock cycle subsequent to the third clock cycle, the logic level of the output signal J2 is changed to the H level from the L level. Thus, in the fourth clock cycle, if the logic level of the output signal I2 returns to the L level, the logic level of the output signal J2 is at the H level because the logic level of the output signal I2 is changed to the H level. In other words, the change of the logic level of the access request signal ERE from the L level to the H level does not change the logic level of the output signal J2 immediately, and makes the change of the logic level of the output signal J2 delay for three clock cycles.

As described above, the third through fifth watching circuits 250, 260, 270 and the second OR gate 287 generates the output signal K2 having the logic level corresponding to the logic level of the access request signal EWE when the CPU 652 does not request for accessing to the SP-RAM 201 and when the external device 650 does not request for accessing to the SP-RAM 201 to read-out data within the particular period including the delayed period. Further, the third through fifth watching circuits 250, 260, 270 and the second OR gate 287 make the rise of the logic level of the output signal K2, based on the access request signal EWE, delay for one, two or three clock cycles in response to the period for the access request to the SP-RAM 201 by the CPU 652 or the external device 650.

The second AND gate 288 receives the output signal K2 and an output signal L2 outputted from the second inverter 286, which inverts the logic level of the output signal G2. Thus, the logic level of the output signal M2 from the second AND gate 288 is at the L level when the level of the output signal G2 is at the H level (when the CPU 652 requests for accessing to the SP-RAM 201 or when the external device 650 requests for accessing to the SP-RAM 201 to read-out data within the particular period including the delayed period). When the logic level of the output signal G2 is at the L level (when the CPU 652 does not request for accessing to the SP-RAM 201, and when the external device 650 does not request for accessing to the SP-RAM 201 to read-out data within the particular period including the delayed period ), the logic level of the output signal M2 is at the H level if the logic level of the access request signal EWE is at the H level (if the external device 650 request for accessing to the SP-RAM 201 to write data), or if the logic level of one the output signals H2, I2, J2 is at the H level (if the request for accessing to the SP-RAM 201 to write data from the external device 650 has been accepted). When the logic level of the output signal G2 is at the L level (the CPU 652 does not request for accessing to the SP-RAM 201 or the external device 650 does not request for accessing to the SP-RAM 201 to read-out data), and when the logic level of all of the output signals H2, I2, J2 and the access request signal EWE is at the L level (the external device 650 does not request for accessing to the SP-RAM 201 to write data), the logic level of the output signal M2 is at the L level.

The NOR gate 209 receives the output signals A2, F2, M2. When the CPU 652 and the external device 650 do not request for accessing to the SP-RAM 201 within the particular period including the delay period (when the logic level of all of the output signals A2, F2, M2 is at the L level), the NOR gate 209 outputs an output signal N2 having the H level to the enable terminal CEN of the SP-RAM201. Therefore, the SP-RAM 201 is in an inactive state in which it is impossible to access the SP-RAM 201. On the other hand, when the logic level of one of the output signals A2, F2, M2 is at the H level (when CPU 652 requests for accessing to the SP-RAM 201 or the external device 650 request for accessing to the SP-RAM 201 in the particular period including the delayed period), the NOR gate 209 outputs the output signal N2 having the H level to the enable terminal CEN of the SP-RAM201. Thus, the SP-RAM 201 is in an active state in which it is possible to access the SP-RAM 201

According to the memory control circuit 602 of the second embodiment, it is possible to schedule that the access request from the CPU 652 is carried out at the first priority, and then, the access request for reading-out data from the external device 650 is carried out at the second priority.

Next, the detail operation of the memory control circuit 162 is explained below with reference to an operation time chart shown in FIG. 4.

Figure 4:
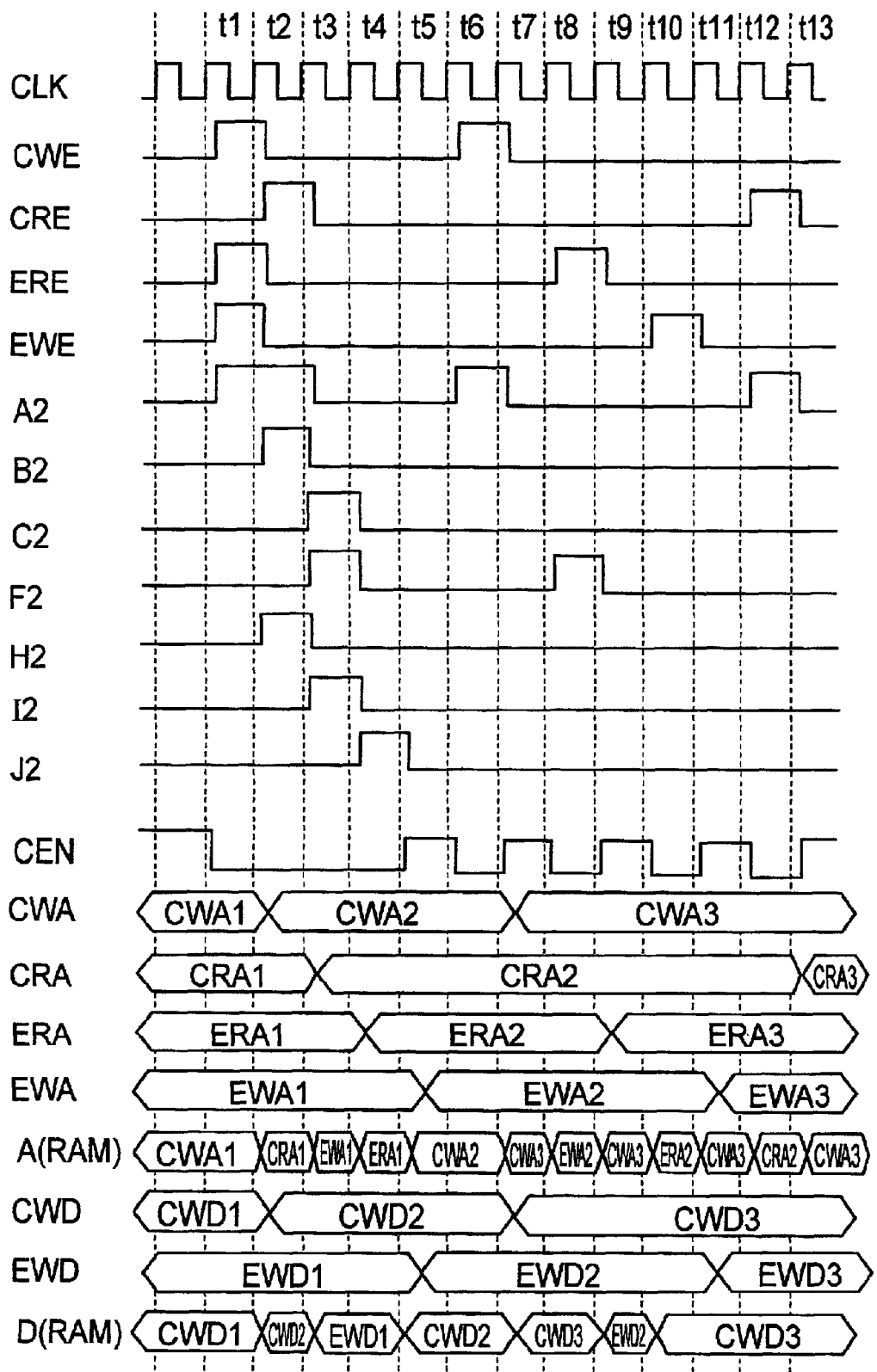
FIG. 4 is a timing chart showing the operation of the data transmitting circuit of FIG. 3.
Figure 5:
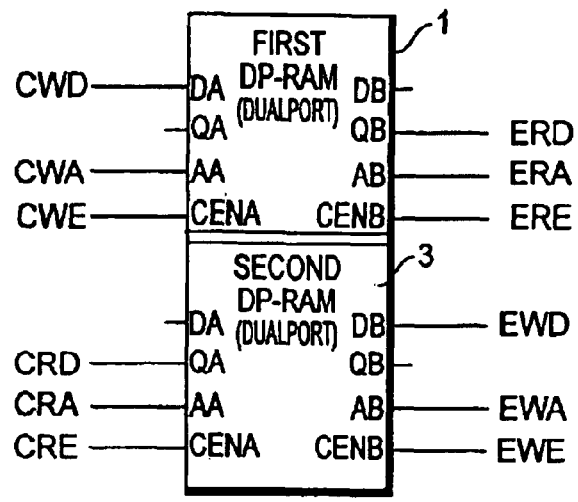
FIG. 5 is a data transmitting circuit of the related art.
Figure 6:
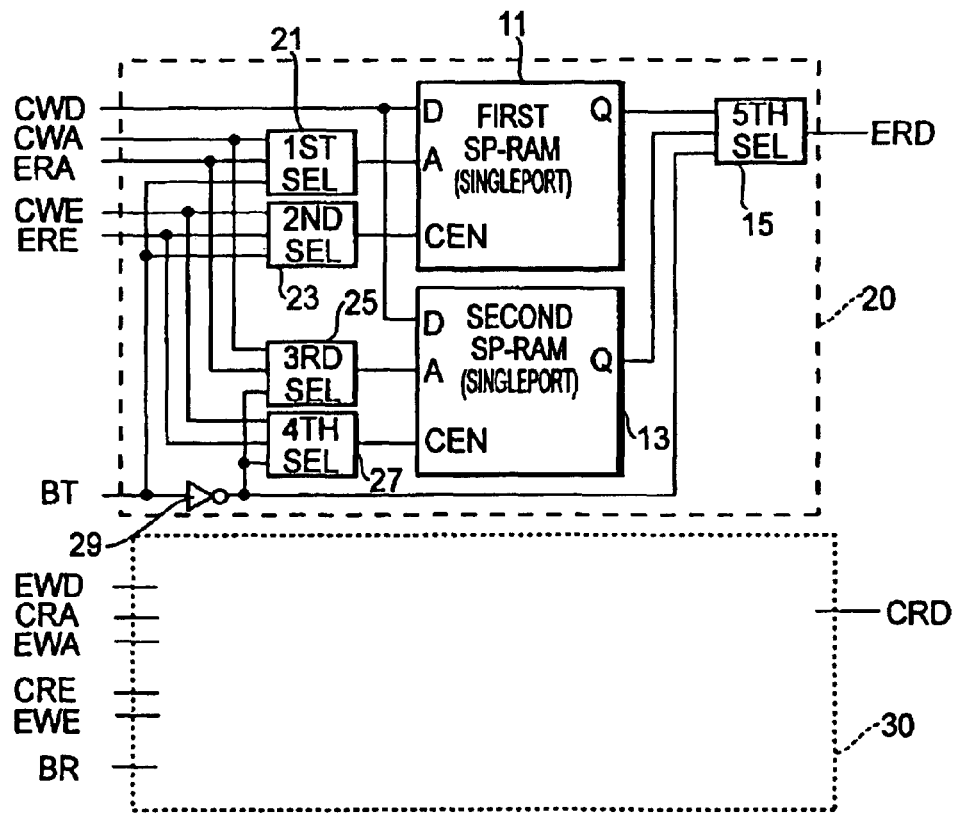
FIG. 6 is another data transmitting circuit of the related art.

In FIG. 4, as an initial state, the logic level of all of the access request signals CWE, CRE, EWE, ERE is at the L level since both of the CPU 652 and the external device 650 do not send any requests to access the SP-RAM 201. Therefore, the logic level of the output signals A2, B2, C2, D2, F2, G2, H2, I2, J2, K2, L2, M2 is at the L level, and the logic level of the output signals E2, N2 is at the H level. Thus, the disable condition of the SP-RAM 201 is maintained.

During time t1, the logic level of all of the access request signals CWE, CRE, EWE, ERE is changed to the H level, the logic level of the output signal A2 is changed to the H level, and the logic level of the output signal N2 is changed to the L level. Since the first watching circuit 210 has not held the signal from the AND gate 211 corresponding to the output signal B2 in its holding circuit 213 yet, the logic level of the output signal C2 is still at the L level. As well as the first watching circuit 210, since the second watching circuit 220 has not held the signal from the AND gate 221 corresponding to the access request signal ERE in its holding circuit 223 yet, the logic level of the output signal B2 is still at the L level. Although the logic level of the output signal D2 is changed to the H level by the changed to at the L level because of the output signal A2 having the H level. Thus, the logic level of the output signal F2 is maintained at the L level. As well as the first and second watching circuit 210, 220, the third through fifth watching circuits 250, 260, 270 output the output signals J2, I2, H2, each having the L level. Although the logic level of the access request signal ERE is at the H level, the logic level of the output signal M is maintained at the L level because the logic level of the output signal L2, which is inverted by the second inverter 286, is at the L level. Therefore, during time t1, the writing address signal CWE from the address generating circuit 203 is selected at the first selection circuit 205 by the output signals M2, F2 and the access request signal CRE, and the writing data CWD is selected at the second selection circuit 233. Thus, based on the request from the CPU 652, the access to the SP-RAM 201 for writing data CWD1 in a memory cell at an address CWA1 is carried out.

During time t2, the process for writing data in the SP-RAM 201, based on the request from the CPU 652, has been completed, and then, the logic level of the access request signals CWE is changed to the L level, and the logic level of the access request signals ERE, EWE is changed to the L level. The second watching circuit 220 accepts the signal having the logic level from the AND gate 221 corresponding to the logic level of the access request signal ERE, and the fifth watching circuit 270 accepts the signal having the logic level from the AND gate 271 corresponding to the logic level of the access request signal EWE when the clock signal rises in the time t2. Thus, the logic level of the output signals B2, H2 is changed to the H level. Further, during time t2, since the logic level of the access request signal, which requests from the CPU 652 for accessing to the SP-RAM 201 to read-out data, is changed to the H level, the logic level of the output signals F2, M2 is maintained at the L level. Thus, the reading-out address signal CRE from the address generating circuit 203 is selected at the first selection circuit 205 by the output signals M2, F2 and the access request signal CRE. Therefore, during time t2, based on the request from the CPU 652, the process for reading-out data from the memory cell designated by the address signal CRA1, is carried out. Here, in response to the change of the logic level of the access request signal CWE to the L level, the address generating circuit 203 generates new address signal CWA, and the new address signal CWA indicates a new address CWA2.

After that, the process for reading-out data from the SP-RAM 201, based on the request from the CPU 652, has been completed, and then, the logic level of the signal from the third holding circuit 245 is changed to the H level when the clock signal rises during time t3. In response to the change of the logic level of the signal from the third holding circuit 245, the fourth holding circuit 247 outputs data read-out from the SP-RAM 201 as the read-out data CRD, and maintains it until the next read-out operation. Here, in response to the change of the logic level of the access request signal CRE to the L level, the address generating circuit 203 generates new address signal CRA, and the new address signal CRA indicates a new address CRA2.

Further, the first watching circuit 210 accepts the signal having the logic level from the AND gate 211 corresponding to the logic level of the output signal B2E, and the fourth watching circuit 260 accepts the signal having the logic level from the AND gate 261 corresponding to the logic level of the output signal H2 when the clock signal rises in the time t3. Thus, since the logic level of the output signals C2, I2 is changed to the H level, the logic level of the output signals D2, K2 is changed to the H level. During time t3, since the CPU 652 does not request for accessing to the SP-RAM 201, the logic level of the output signal A2 is at the L level. Thus, the logic level of the output signal F2 is changed to the H level. Since the logic level of the output signal G2 is maintained at the H level, the logic level of the output signal M2 is maintained at the L level. Thus, the reading-out address signal ERA from the address generating circuit 203 is selected at the first selection circuit 205 by the output signals M2, F2 and the access request signal CRE. Therefore, during time t3, based on the request from the external device 650, the process for reading-out data from the memory cell designated by the address signal ERA1, is carried out.

After that, the process for reading-out data from the SP-RAM 201, based on the request from the external device 650, has been completed, and then, the logic level of the output signal F2 returns to the L level at time t4. The logic level of the signal from the first holding circuit 235 is changed to the H level when the clock signal CLK rises during time t4. In response to the change of the logic level of the signal from the first holding circuit 235, the second holding circuit 236 outputs data read-out from the SP-RAM 201 as the read-out data ERD, and maintains it until the next read-out operation. Further, since the third watching circuit 250 accepts the signal having the logic level corresponding to the logic level of the output signal I2 when the clock signal CLK rises during time t4, the logic level of the output signal J2 is changed to the H level during time t4. Thus, the logic level of the output signal K2 is changed to the H level. Under this state, since the logic level of the output signals A2, F2 is at the L level because the CPU 652 does not request for access the SP-RAM 201 and the external device 650 does not request for access the SP-RAM 201 to read-out data, the logic level of the output signal G2 is changed to the L level. Thus, since the logic level of the output signal L2 is changed to the H level, the logic level of the output signal M2 is changed to the H level. Therefore, the writing address signal EWA from the address generating circuit 203 is selected at the first selection circuit 205 by the output signals M2, F2 and the access request signal CRE, and the writing data EWD, based on the request from the external device 650, is selected at the second selection circuit 233. Thus, based on the request from the external device 650, the access to the SP-RAM 201 for writing data EWD in a memory cell at an address EWA1 is carried out. Here, in response to the change of the logic level of the access request signal ERE to the L level, the address generating circuit 203 generates new address signal ERA, and the new address signal ERA indicates a new address ERA2.

After that, the process for writings data to the SP-RAM 201, based on the request from the external device, has been completed, and then, the logic level of the output signal J2 is changed to the L level when the clock signal rises during time t5. Therefore, since the logic level of the output signal M2 is changed to the L level, memory control circuit 602 returns to the initial state. Here, in response to the change of the logic level of the output signal M2 to the L level, the address generating circuit 203 generates new address signal EWA, and the new address signal EWA indicates a new address EWA2.

After that, during time t6, by changing the logic level of the access request signal CWE to the H level, the logic level of the output signal A2 is changed to the H level, and the logic level of the output signals F2, M2 is changed to the L level. Thus, since the address generating circuit 203, and first and second selection circuit 205, 233 receive the signals each having the logic level, which is the same logic level in time t1. Thus, based on the request from the CPU 652, the access to the SP-RAM 201 for writing data in a memory cell, is carried out.

After the process for writing data to the SP-RAM 201, based on the request from the CPU 652, has been completed, the address signal CWA is renewed in time t7. The new address signal CWA indicates a new address CWA3.

After that, during time t8, by changing the logic level of the access request signal ERE to the H level, the logic level of the output signal F2 is changed to the H level, the logic level of the output signal A2 is changed to the L level, and the logic level of the output signal M2 is maintained at the L level. Thus, since the address generating circuit 203, and first and second selection circuit 205, 233 receive the signals each having the logic level, which is the same logic level in time t3. Thus, based on the request from the external device 650, the access to the SP-RAM 201 for reading-out data from a memory cell, is carried out.

After the process for reading-out data from the SP-RAM 201, based on the request from the external device 650, has been completed, the address signal ERA is renewed in time t9. The new address signal ERA indicates a new address ERA3.

After that, during time t10, by changing the logic level of the access request signal EWE to the H level, the logic level of the output signal M2 is changed to the H level, the logic level of the output signal F2 is changed to the L level, and the logic level of the output signal A2 is maintained at the L level. Thus, since the address generating circuit 203, and first and second selection circuit 205, 233 receive the signals each having the logic level, which is the same logic level in time t4. Thus, based on the request from the external device 650, the access to the SP-RAM 201 for writing data to a memory cell, is carried out.

After the process for writing data to the SP-RAM 201, based on the request from the external device 650, has been completed, the address signal EWA is renewed in time t11. The new address signal EWA indicates a new address EWA3.

After that, during time t12, by changing the logic level of the access request signal CRE to the H level, the logic level of the output signal A2 is changed to the H level, the logic level of the output signal M2 is changed to the L level, and the logic level of the output signal F2 is maintained at the L level. Thus, since the address generating circuit 203, and first and second selection circuit 205, 233 receive the signals each having the logic level, which is the same logic level in time t2. Thus, based on the request from the CPU 652, the access to the SP-RAM 201 for reading-out data from a memory cell, is carried out.

After the process for reading-out data from the SP-RAM 201, based on the request from the CPU 652, has been completed, the address signal CRA is renewed in time t13. The new address signal CRA indicates a new address CRA3.

According to the memory control circuit 602 of the second embodiment, as well as the first and second memory control circuit 160, 170, when the access request signals from the CPU 652 and from the external device 650 are inputted, it is possible to schedule that the high priority request is carried out prior to the low priority request, and then, the low priority request can be carried out later. Further, when two access request signals from the external device 650 are inputted, it is possible to schedule that the high priority request is carried out prior to the low priority request, and then, the low priority request can be carried out later. Moreover, the single SP-RAM 201 are commonly used for a first circuit for sending data and a second circuit for receiving data in the data transmitting circuit 600 in the second embodiment. Therefore, comparing to the data transmitting circuit 500, it is possible to reduce the cost, to reduce the chip size, and to reduce the power consumption further.

Moreover, the memory control circuit 602 in the second embodiment and the first and second memory control circuit 160, 170 in the first embodiment can be formed by the simple circuit elements, and the complicated timing control is not required for them. Therefore, these memory control circuits can be applied not only to the data transmitting circuit, but also to the other circuit, which has the same problem.

While the present invention has been described with reference to illustrative embodiments, this description is not intended to be construed in a limiting sense. Various other modifications of the illustrated embodiments, as well as other embodiments of the invention, will be apparent to those skilled in the art on reference to this description. For example, each of all holding circuits in the first and second embodiments may accept the signals in response to the change of the clock signal to the L level. Further, each of the holding circuit in the first and second embodiments may be formed by a latch circuit, which controls to hold or pass through the logic level of the signal inputted in response to the clock signal CLK. Specifically, if the holding circuits 235, 245 in the second embodiment accept the signals in response to the change of the clock signal to the L level, a desired read-out data an be outputted in a read-out clock cycle. Thus, high speed operation can be expected.

Further, when the operation of each circuit in the memory control circuits 160, 170, 602 is controlled, the logic level of the signals or the output signals is not limited to these described in the first and second embodiment.

Furthermore, it is possible to performed the access request from the external device 650 prior to that from the CPU 652, and it is also possible to change the priority between the reading-out request and the writing request.

If it is necessary to schedule the priority among access requests from other external devices or from internal devices other than the CPU 652, the number of the watching circuit to a group of the first and second watching circuits 210, 220 (two clock cycle delay) or to another group of the third through fifth watching group 250, 260, 270 (three clock cycle delay) may be increased. Of course, it is possible to form a group of new watching circuits to make the signal delay for N clock cycle (N is integral number of one or 4 or more).

Although the memory control circuits 160, 170, 602 of the first and second embodiments can be used for controlling the SP-RAMs 101, 151, 201, they can be used for controlling another type of memory. For, example, if the CPU and the external device request for access the memory to read-out data only, they can be used for controlling a ROM. Therefore, the appended claims are intended to cover any such modifications or embodiments as fall within the true scope of the invention.

What I claim is:

1. A memory control circuit enabling a memory to be accessed from a first processing device in response to a first or a second processing request signal, and enabling the memory to be accessed from a second device in response to a third or a fourth processing request signal, comprising:

a first group of watching circuits observing whether both of the first and second processing devices request access to the memory, based on the first and second processing request signal and the third processing request signals, a second group of watching circuits observing whether both of the first and second processing devices request access to the memory, based on the first and second processing request signals and the signal representing an observation of the first group of watching circuits and the fourth processing request signal, an address generating circuit generating and outputting a first address signal in response to the first processing request signal, a second address signal in response to the second processing request signal, a third address signal in response to the third processing request signal, and a fourth address signal in response to the fourth processing request signal, a selection circuit, which is responsive to a selection signal, outputting one of the first through fourth address signals to the memory, and a control circuit generating the selection signal, the control circuit outputting the selection signal for selecting the first or second address signal prior to the third or fourth address signal when signals representing an observation of the first or second group of watching circuits indicate that both of the first and second processing devices request access to the memory.

2. A memory control circuit as claimed in claim 1, wherein the control circuit selects the first or second address signal prior to the third and fourth address signals when both of the signals representing the observations of the first and second watching circuits indicate that both of the first and second processing devices request access to the memory, and then, after the first processing device has completed to access the memory, the control circuit selects the third address signal prior to the fourth address signal.

3. A memory control circuit as claimed in claim 2, wherein the memory control circuit is used in a data transmitting device for sending and receiving data with an external device, the first processing device is a central processing unit incorporated in the data transmitting device, and the second processing device is the external device, which is outside the data transmitting device.

4. A memory control circuit as claimed in claim 3, wherein the first processing request signal has a logic level that changes when the central processing unit requests access to the memory to write data, wherein the second processing request signal has a logic level that changes when the central processing unit requests access to the memory to read-out data, wherein the third processing request signal has a logic level that changes when the external device requests access to the memory to read-out data, and wherein the fourth processing request signal has logic level that changes when the external device requests access to the memory to write data.

5. A memory control circuit as claimed in claim 1, wherein the memory control circuit is used in a data transmitting device for sending and receiving data with an external device, the first processing device is a central processing unit incorporated in the data transmitting device, and the second processing device is the external device, which is outside the data transmitting device.

6. A memory control circuit as claimed in claim 5, wherein the first processing request signal has a logic lever that changes when the central processing unit requests access to the memory to write data, wherein the second processing request signal has a logic level that changes when the central processing unit requests access to the memory to read-out data, wherein the third processing request signal has a logic level that changes when the external device requests access to the memory to read-out data, and wherein the fourth processing request signal has logic level that changes when the external device requests access to the memory to write data.

* * * * *